US010650730B2

(12) United States Patent
Son et al.

(10) Patent No.: US 10,650,730 B2
(45) Date of Patent: May 12, 2020

(54) DISPLAY PANEL AND DISPLAY APPARATUS USING THE SAME

(71) Applicant: LG Display Co., Ltd., Seoul (KR)

(72) Inventors: Jungeun Son, Paju-si (KR); Hyeonho Son, Goyang-si (KR); Jinyeong Kim, Goyang-si (KR); Hanchul Park, Seoul (KR); Seonghwan Ju, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 36 days.

(21) Appl. No.: 16/023,092

(22) Filed: Jun. 29, 2018

(65) Prior Publication Data
US 2019/0005870 A1    Jan. 3, 2019

(30) Foreign Application Priority Data
Jun. 29, 2017  (KR) .................. 10-2017-0082710

(51) Int. Cl.
| *G09G 3/32* | (2016.01) |
| *H01L 27/12* | (2006.01) |
| *H01L 25/16* | (2006.01) |
| *H01L 25/075* | (2006.01) |
| *H01L 33/62* | (2010.01) |
| *H01L 27/32* | (2006.01) |

(52) U.S. Cl.
CPC .......... *G09G 3/32* (2013.01); *H01L 25/0753* (2013.01); *H01L 25/167* (2013.01); *H01L 27/124* (2013.01); *H01L 27/326* (2013.01); *H01L 33/62* (2013.01); *G09G 2300/0814* (2013.01); *G09G 2310/0278* (2013.01)

(58) Field of Classification Search
CPC ............. G09G 3/32; G09G 2300/0814; G09G 2310/0278; H01L 25/0753; H01L 25/167; H01L 27/124; H01L 27/326; H01L 33/62
See application file for complete search history.

(56) References Cited

U.S. PATENT DOCUMENTS

| 6,531,815 B1 * | 3/2003 | Okuyama ........... H01L 27/3276 |
| | | 313/498 |
| 9,153,171 B2 * | 10/2015 | Sakariya ................ H01L 25/167 |
| 10,395,589 B1 * | 8/2019 | Vahid Far ............ G09G 3/3283 |
| 2005/0116615 A1 | 6/2005 | Matsumoto et al. |

(Continued)

FOREIGN PATENT DOCUMENTS

WO    2015/193868 A2    12/2015

OTHER PUBLICATIONS

European Search Report dated Nov. 12, 2018 issued in connection with the corresponding European Patent Application No. 18180280.2.

*Primary Examiner* — Stacy Khoo
(74) *Attorney, Agent, or Firm* — Morgan, Lewis & Bockius LLP

(57) ABSTRACT

A display panel and a display apparatus using the same are disclosed. A display panel includes a base substrate including a plurality of pixel regions having corresponding gate lines and data lines, and a plurality of pads arranged at an outer periphery of the base substrate. The display panel further includes a group of subminiature light emitting diodes (LEDs) in each of the pixel regions to display an image. The subminiature LEDs in one of the pixel regions are arranged at locations within the one of the pixel regions based on a location of the one of the pixel regions with respect to a center of the base substrate.

18 Claims, 7 Drawing Sheets

(56) References Cited

U.S. PATENT DOCUMENTS

| | | | |
|---|---|---|---|
| 2014/0027709 A1* | 1/2014 | Higginson | H01L 23/3171 257/13 |
| 2015/0131321 A1 | 5/2015 | Im et al. | |
| 2016/0141353 A1 | 5/2016 | Kim et al. | |
| 2017/0170360 A1* | 6/2017 | Bour | H01L 33/145 |
| 2018/0068884 A1* | 3/2018 | Chaji | H01L 22/12 |
| 2018/0287027 A1* | 10/2018 | Chaji | H01L 33/0079 |

\* cited by examiner

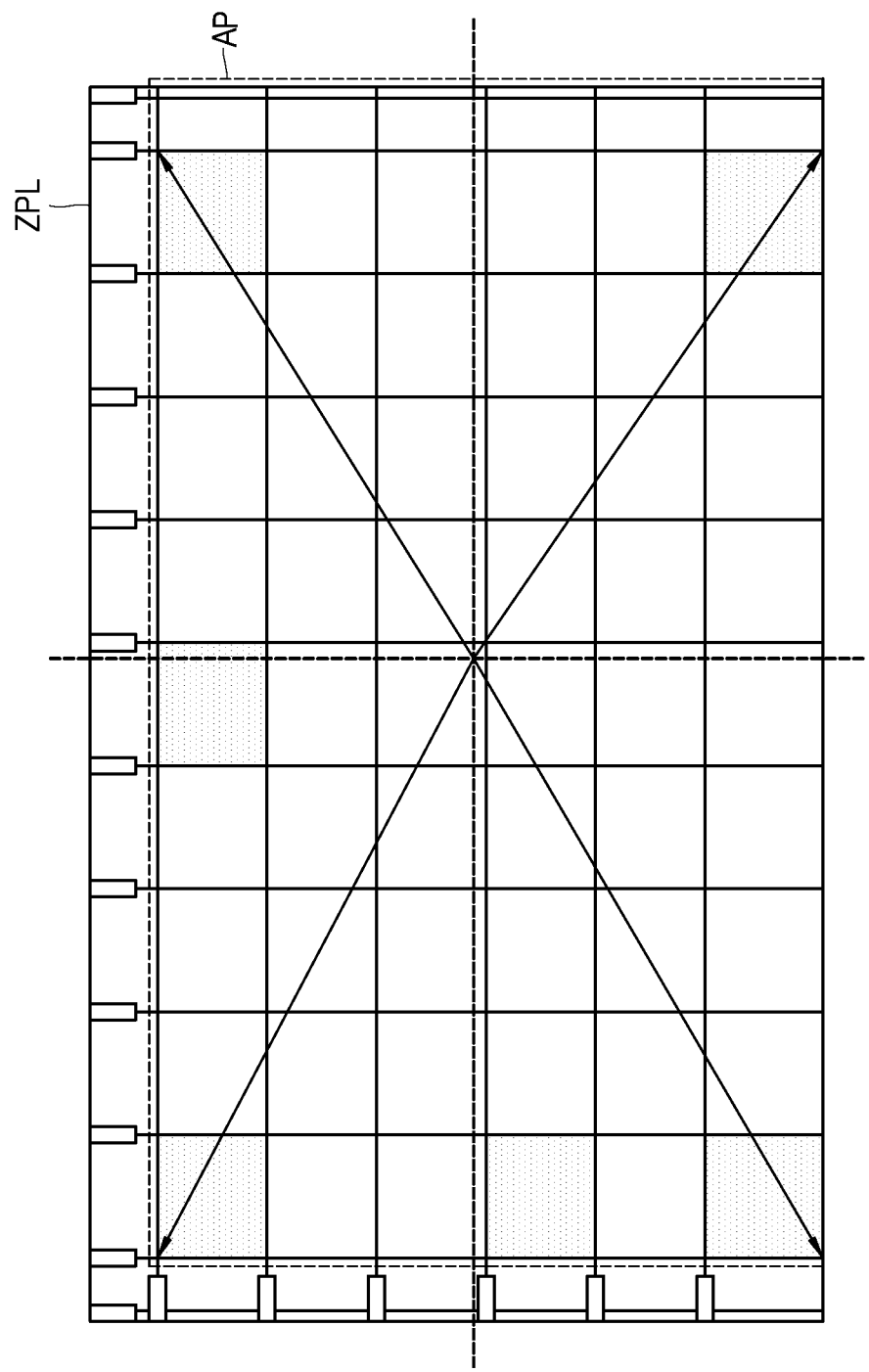

DISPLAY PANEL AND DISPLAY APPARATUS USING THE SAME

CROSS-REFERENCE TO RELATED APPLICATIONS

This application claims the priority of Korean Patent Application No. 10-2017-0082710 filed on Jun. 29, 2017, in the Korean Intellectual Property Office, which is incorporated herein by reference for all purposes as if fully set forth herein.

BACKGROUND

1. Technical Field

The present disclosure relates to a display panel and a display apparatus, and more particular to a display panel which includes LEDs arranged to form pixels for displaying an image, including, for example, a display panel which allows easy arrangement of LEDs in pixel regions during manufacturing, and a display apparatus using the same.

2. Description of the Related Art

A light emitting diode (LED) is a semiconductor light emitting device configured to convert current into light and has attracted much attention in the field of image displays and high-output electronic components due to its high thermal stability and broad bandgap characteristics (0.8 eV to 6.2 eV).

To increase the pixel resolution of a display, the display typically needs to employ smaller LEDs. However, as LEDs become smaller, the use of LEDs in a display becomes more challenging due to technical limitations in manufacturing equipment and obtainable resolution. Accordingly, despite their high efficiency, the use of LEDs in display devices has been limited to such applications as displays for outdoor electronic signboards or backlight units for liquid crystal display (LCD) devices.

Recently, high-efficiency LEDs having good physical and chemical properties have been manufactured, for example in micro-sized or subminiature scale, to be used in full-color LED displays rather than in simple backlight units. Particularly, various attempts have been made to arrange such subminiature LEDs on a TFT (thin-film transistor) switching substrate for typical displays to form pixels for displaying an image. However, to arrange such subminiature LEDs as image display elements in pixel regions of the TFT switching substrate for a display device, changes should be made to the layout and design of the LEDs corresponding, for example, to the area of an image display region of the TFT switching substrate, pixel size, resolution, and the like.

Further, it is more difficult to change the layout and design of subminiature LEDs corresponding to characteristics of a TFT switching substrate for so-called narrow-bezel or zero-bezel display panels, which are emerging recently. In other words, it is difficult to adjust the layout and design of the subminiature LEDs, for example, with respect to the size of the connection pads in a non-display region of the TFT switching substrate, the size of the substrate, the size of pixels, pixel resolution, and the like.

Particularly, some typical TFT switching substrates for narrow-bezel or zero-bezel display panels are designed such that pixel regions adjacent to an outer pad region are different in size than pixel regions at the center of the base substrate. Accordingly, even if the layout and design of subminiature LEDs are changed corresponding to the characteristics of a TFT switching substrate for narrow-bezel or zero-bezel display panels, the structure or pattern of LEDs in pixel regions at an outer periphery of the substrate may be different from that of LEDs in central pixel regions. As a result, automated design and efficient panel inspection are difficult, if not impossible, which can lead to an increase in defects.

SUMMARY

Accordingly, embodiments of the present disclosure are directed to a display panel and a display apparatus using the same that substantially obviate one or more of the problems due to limitations and disadvantages of the related art.

One aspect of the present disclosure is to provide a display panel which allows for easy arrangement of subminiature LEDs in pixel regions of a TFT switching substrate for different types of display devices, and a display apparatus using the same.

It is another aspect of the present disclosure to provide a narrow-bezel or zero-bezel display panel which allows subminiature LEDs to be arranged in pixel regions without any additional design change in manufacture thereof, and a display apparatus using the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display panel includes: a base substrate comprising a plurality of pixel regions having corresponding gate lines and data lines, a plurality of pads arranged at an outer periphery of the base substrate; and a group of subminiature light emitting diodes (LEDs) in each of the pixel regions to display an image, wherein the subminiature LEDs in one of the pixel regions are arranged at locations within the one of the pixel regions based on a location of the one of the pixel regions with respect to a center of the base substrate.

The subminiature LEDs in the one of the pixel regions may be arranged at locations within the one of the pixel regions based on a direction in which the one of the pixel regions is disposed away from the center of the base substrate and on a distance between the one of the pixel regions and the center of the base substrate.

The pixel regions may include a first pixel region and a second pixel region farther away from the center of the base substrate than the first pixel region in a plan view. The subminiature LEDs of the first pixel region may be arranged in a substantially same pattern as the subminiature LEDs of the second pixel region. On average, the subminiature LEDs of the second pixel region may be arranged farther away from a center of the second pixel region than the subminiature LEDs of the first pixel region are from a center of the first pixel region in the plan view.

One of the pixel regions may comprise: a plurality of thin film transistors (TFTs) configured to switch on data voltages in response to a gate-on voltage; a low voltage contact pad configured to receive a low supply voltage; and a plurality of data contact pads, each configured to transmit a corresponding one of the data voltages from a corresponding one of the TFTs to a corresponding one of the subminiature LEDs. The subminiature LEDs in the one of the pixel regions may comprise: at least one red LED, at least one green LED, and at least one blue LED, each of which has a cathode and an anode, and is configured to emit light by receiving, at the cathode, the low supply voltage from the low voltage contact pad and by receiving, at the anode, a corresponding one of the data voltages from a corresponding one of the data contact pads.

Each of the data contact pads may be configured to receive the corresponding one of the data voltages from the corresponding one of the TFTs and to supply the corresponding one of the data voltage to a corresponding one of the at least one red, at least one green, and at least one blue subminiature LEDs.

The data contact pads may correspond in number to the TFTs or to the subminiature LEDs, and are respectively located in sections of the one of the pixel regions excluding an area occupied by the low voltage contact pad.

Further, the data contact pads each may have a planar shape with substantially equal area and size with one another, and are each connected to the corresponding one of the subminiature LEDs via a contact point. The contact point may be positioned at a location with respect to the corresponding one of the data pads based on the location of the one of the pixel regions with respect to the center of the base substrate.

In another aspect, a display apparatus includes: a display panel comprising a base substrate having a plurality of pixel regions, and a group of subminiature light emitting diodes (LEDs) in each of the pixel regions to display an image, the subminiature LEDs in one of the pixel regions being disposed at locations within the one of the pixel regions based on a direction in which the one of the pixel regions is disposed away from a center of the base substrate and on a distance between the one of the pixel regions and the center of the base substrate; and a driving circuit configured to apply a high voltage and a low voltage to the pixel regions and to drive gate lines and data lines of the pixel regions such that an image is displayed by the subminiature LEDs in the pixel regions.

Here, the driving circuit may be disposed on a back side of the base substrate, and may be configured to apply the high voltage and the low voltage to the pixel regions via a high voltage supply line and a low voltage supply line, respectively. The high voltage supply line and low voltage supply line each may extend from the back side to a front side of the base substrate. The gate lines and the data lines may extend from the back side of the base substrate to the respective pixel regions in the front side of the base substrate. The driving circuit may be further configured to drive the gate lines and the data lines to cause the subminiature LEDs in the respective pixel regions to display an image.

In yet another aspect, an apparatus includes: a matrix of pixel regions on a substrate and having a first arrangement with a first pitch between adjacent pixel regions; a set of connection pads in each of the pixel regions and having a uniform layout; and a matrix of micro-sized light emitting diodes (LEDs) in each of the pixel regions to output images on a display screen, the matrix of micro-sized LEDs having a second arrangement different from the first arrangement and a second pitch between adjacent micro-sized LEDs different from the first pitch, wherein each of the micro-sized LEDs in one of the pixel regions is electrically connected via a contact point to a corresponding one of the connection pads in the one of the pixel regions.

Each of the connection pads in the one of the pixel regions may have a uniform size sufficient to accommodate its corresponding micro-sized LED, regardless of any differences in the first pitch of the adjacent pixel regions and the second pitch of the adjacent micro-sized LEDs.

A first set of micro-sized LEDs in a first pixel region near a central area of the matrix of pixel regions may have a first set of contact points, and a second set of micro-sized LEDs in a second pixel region near an edge of the matrix of pixel regions may have a second set of contact points that are arranged differently from the first set of contact points.

The uniform layout and the uniform size of the connection pads may depend upon an overall size of the display screen or of the matrix of micro-sized LEDs.

The connection pads in the one of the pixel regions may include six pads, and the micro-sized LEDs in the one of the pixel regions may include a pair of red LEDs, a pair of green LEDs and a pair of blue LEDs.

The connection pads in the one of the pixel regions may further include a seventh pad configured to provide contact with a supply voltage (Vss) for the one of the pixel regions.

The present disclosure provides a display panel which allows for easy arrangement of subminiature LEDs in pixel regions of a TFT switching substrate, thereby reducing design and production costs and improving automated design efficiency, and a display apparatus using the same.

In addition, the present disclosure provides a narrow-bezel or zero-bezel display panel which allows subminiature LEDs to be arranged in pixel regions without any additional design change in manufacture thereof, thereby reducing design and production costs, and a display apparatus using the same.

Further, the present disclosure provides a display panel which allows a plurality of subminiature LEDs to be arranged in each pixel region in a particular pattern in a direction away from the center of the base substrate, thereby improving ease of automated design and panel inspection.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings:

FIG. 7 is a diagram illustrating data voltage contact positions of an example narrow- or zero-bezel type TFT switching substrate with subminiature LEDs arranged in a particular pattern thereon.

DETAILED DESCRIPTION

Example embodiments of the present disclosure will now be described in detail with reference to the attached drawings. It should be understood that descriptions of details apparent to those skilled in the art may be omitted.

Figure 1:
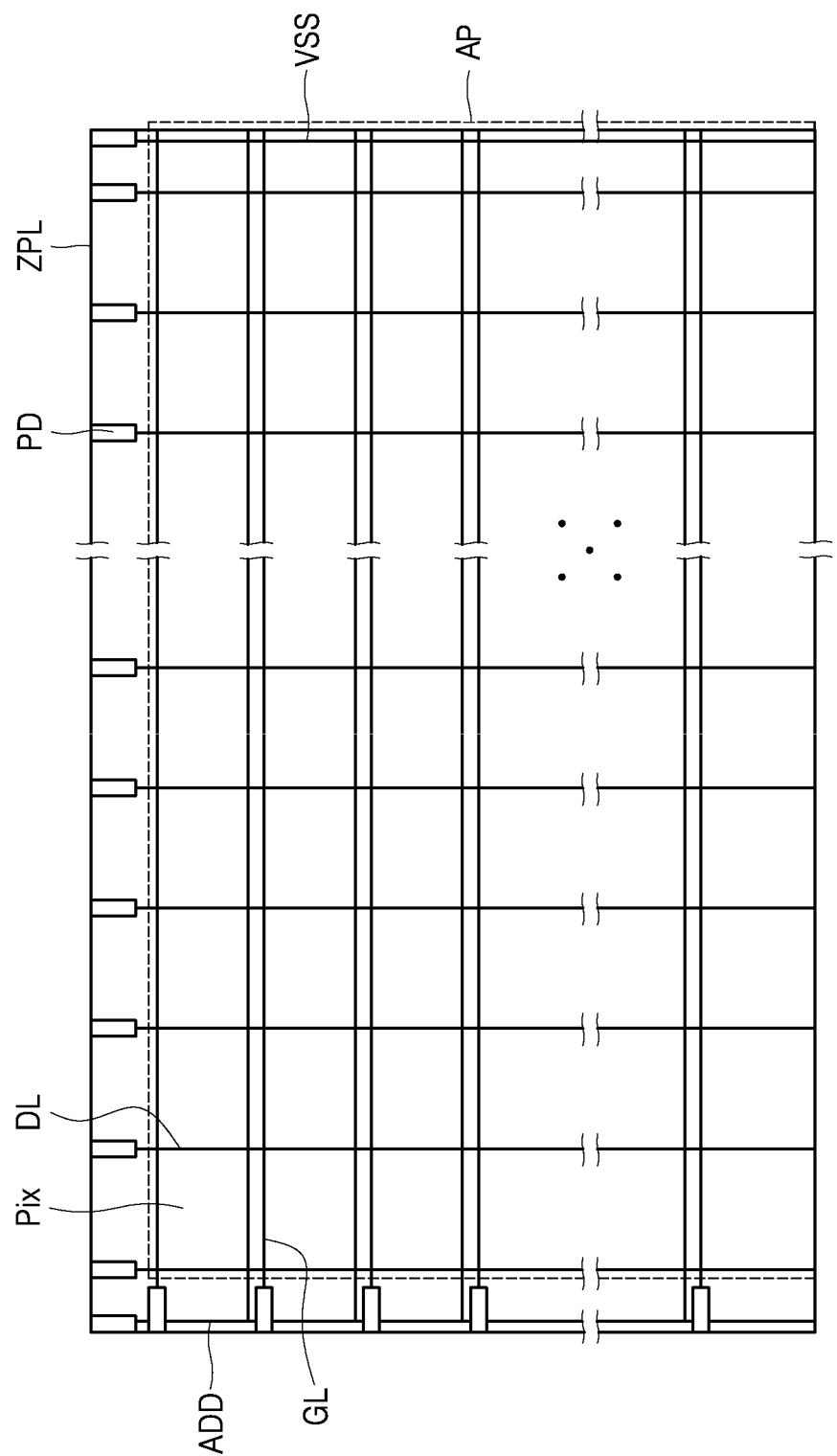
FIG. 1 is a schematic diagram of a display panel according to an example embodiment of the present disclosure.
Figure 2:
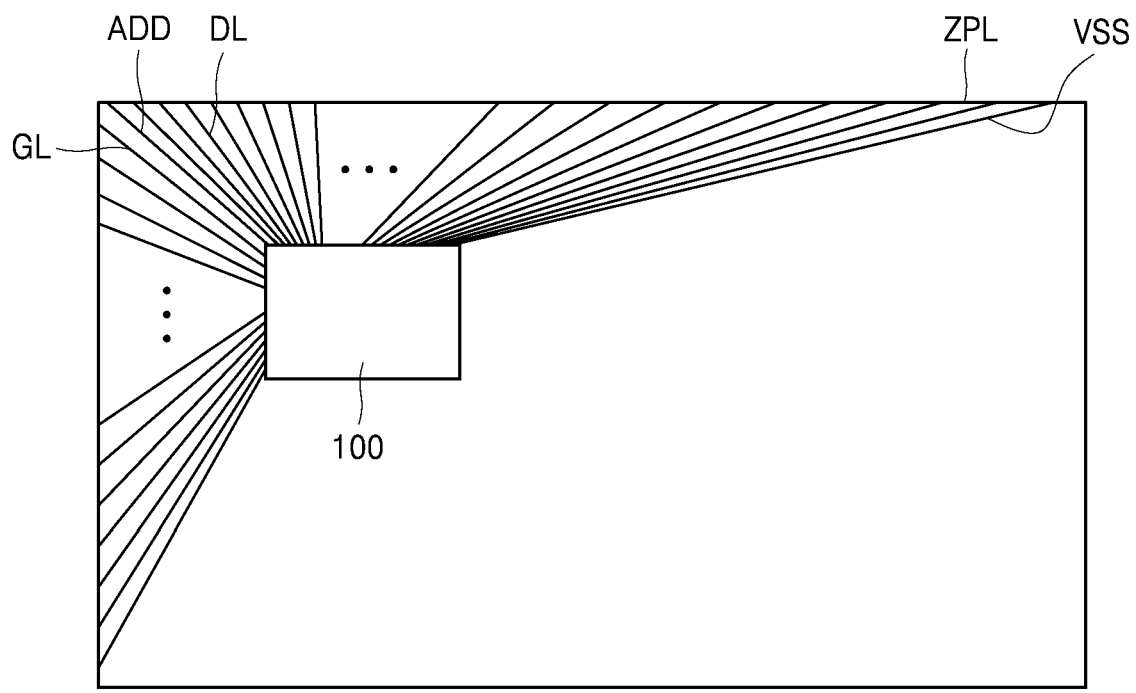
FIG. 2 is a rear view of the display panel of FIG. 1, which shows an example back side of the display panel and an example panel driver.

FIG. 1 is a schematic diagram of a display panel according to an example embodiment of the present disclosure. FIG. 2 is a rear view of the display panel of FIG. 1, which shows an example back side of the display panel and an example panel driver.

As illustrated in FIG. 1, the display panel according to this example embodiment of the present disclosure may include a base substrate ZPL having a plurality of pixel regions Pix defined by a plurality of gate lines GL and a plurality of data lines DL, and a plurality of pads PD arranged at an outer periphery or side of the base substrate ZPL. The display panel may also include a group of subminiature (or micro-sized) LEDs arranged in each of the pixel regions Pix in a particular pattern corresponding to a direction away from the center of the base substrate ZPL and a distance of each pixel region from the center of the base substrate ZPL to display an image. Namely, the LED arrangement in a pixel region near the center of the base substrate ZPL may be different from the LED arrangement in a pixel region further away from the center.

The plurality of gate lines GL and the plurality of data lines DL may respectively be horizontally and vertically disposed (i.e., along a row direction and a column direction) on the base substrate ZPL to cross one another, thereby defining the plurality of pixel regions Pix. In addition, the base substrate ZPL may include a high voltage supply line VDD and a low voltage supply line VSS disposed at right and left sides thereof, respectively, wherein the high voltage supply line VDD and the low voltage supply line VSS may each have a plurality of branches extending in the direction of the gate lines GL to supply high voltage and low voltage to the pixel regions. The plurality of pads PD may be formed at the outer periphery or side of the base substrate ZPL to extend the gate lines GL, the data lines DL, the high voltage supply line VDD, and the low voltage supply line VSS. Specifically, the plurality of pads PD may be formed along an outer periphery of a front of the base substrate ZPL, or may be formed on a back or side of the base substrate ZPL.

If the plurality of pads PD is formed around the outer periphery of the front of the base substrate ZPL, as shown in FIG. 1, a layout on the base substrate may be designed or manufactured such that the area of an image display region AP varies depending on the size of the pads PD or the area occupied by the pads PD. For example, depending on the area of the image display region AP, the distance between adjacent gate lines GL or between adjacent data lines DL may be reduced in order to reduce the size of the pixel regions Pix. Alternatively, at least one of the pixel regions Pix adjacent to the plurality of pads PD may have a smaller size than the other pixel regions Pix.

With the related art, if the layout on the base substrate were designed such that all or some of the pixel regions are reduced in size depending on the size of the pads PD or the area occupied by the pads PD, as described above, the layout of the subminiature LEDs would need to be adjusted such that the distance between adjacent subminiature LEDs is reduced in order to mount or integrate each subminiature LEDs properly in each pixel region.

According to an example embodiment of the present disclosure, each data contact pad used for transferring data voltage to an anode of each of the subminiature LEDs disposed in each pixel region Pix of the base substrate ZPL may be formed in a planar shape having a specific area. In other words, each data contact pad may have a planar polygonal shape having a particular area instead of a conventional contact hole or contact line-shape. Accordingly, even if the layout on the base substrate ZPL is designed such that the area of the image display region AP of the base substrate ZPL or the size of the pixel regions Pix is varied, the subminiature LEDs can be arranged in each pixel region without changing the layout of the subminiature LEDs, and the subminiature LEDs have a particular pattern.

Since each data contact pad has a planar shape having a specific area to be widened in a contact area, the subminiature LEDs can be electrically connected to the data contact pads, respectively, even if the subminiature LEDs are arranged in the particular pattern in each pixel region Pix without changing the layout. Particularly, since the base substrate ZPL is configured such that the area of the image display region AP or the size of the pixel regions Pix is reduced without changing the layout of the subminiature LEDs, the subminiature LEDs in each pixel region Pix may be arranged at constant intervals (in a direction away from the center of the base substrate ZPL).

According to an example embodiment of the present disclosure, if the base substrate ZPL is configured such that the overall size or area of the pixel regions Pix is reduced due to the plurality of pads PD in the outer periphery of the base substrate ZPL, as shown in FIG. 1, the subminiature LEDs in each pixel region Pix may be arranged in a particular pattern with respect to the center of the base substrate ZPL without changing the layout of the subminiature LEDs, such that a pixel region Pix father away from the center of the image display region AP has the subminiature LEDs arranged in the same direction as a direction away from the center of the image display region AP.

Here, the particular pattern may be an arrangement pattern in which the subminiature LEDs are arranged at particular constant intervals. Accordingly, in a pixel region Pix farther away from the center of the image display region AP, each subminiature LED may be disposed closer to an outer periphery of the pixel region Pix.

Here, the distance between each pixel region Pix from the center of the image display region AP may vary depending on the area of the image display region AP or the size of the corresponding pixel region Pix. Accordingly, the location of each subminiature LED in a pixel region Pix may be different from the location each subminiature LED in another pixel region Pix. However, the distance between groups of subminiature LEDs in adjacent pixel regions Pix may be constant according to the particular pattern.

Now, a pixel structure and data contact pad structure of the base substrate ZPL according to an example embodiment of the present disclosure will be described in detail with reference to the accompanying drawings. As illustrated in FIG. 2, a driving circuit 100 or accessory circuit elements may be disposed on a back of the display panel, that is, on a back of the base substrate ZPL.

The driving circuit 100 may be disposed on the back of the base substrate ZPL to apply high voltage and low voltage to the plurality of pixel regions Pix via the high voltage supply line VDD and the low voltage supply line VSS, respectively. In addition, the driving circuit 100 may drive the plurality of gate lines GL and the plurality of data lines DL on a horizontal line and frame basis such that an image can be displayed by the subminiature LEDs in the pixel regions Pix.

The driving circuit 100 may generate gate signals for sequentially driving the plurality of gate lines GL, and may sequentially generate and output gate-on voltage (for example, low- or high-level gate voltages) using the gate signals. In addition, the driving circuit 100 may convert digital image data received from an external source or stored in the driving circuit 100 into analog voltages, e.g., analog data voltages, and output the analog voltages to the data lines DL at the timing of outputting the gate-on voltage.

Figure 3:
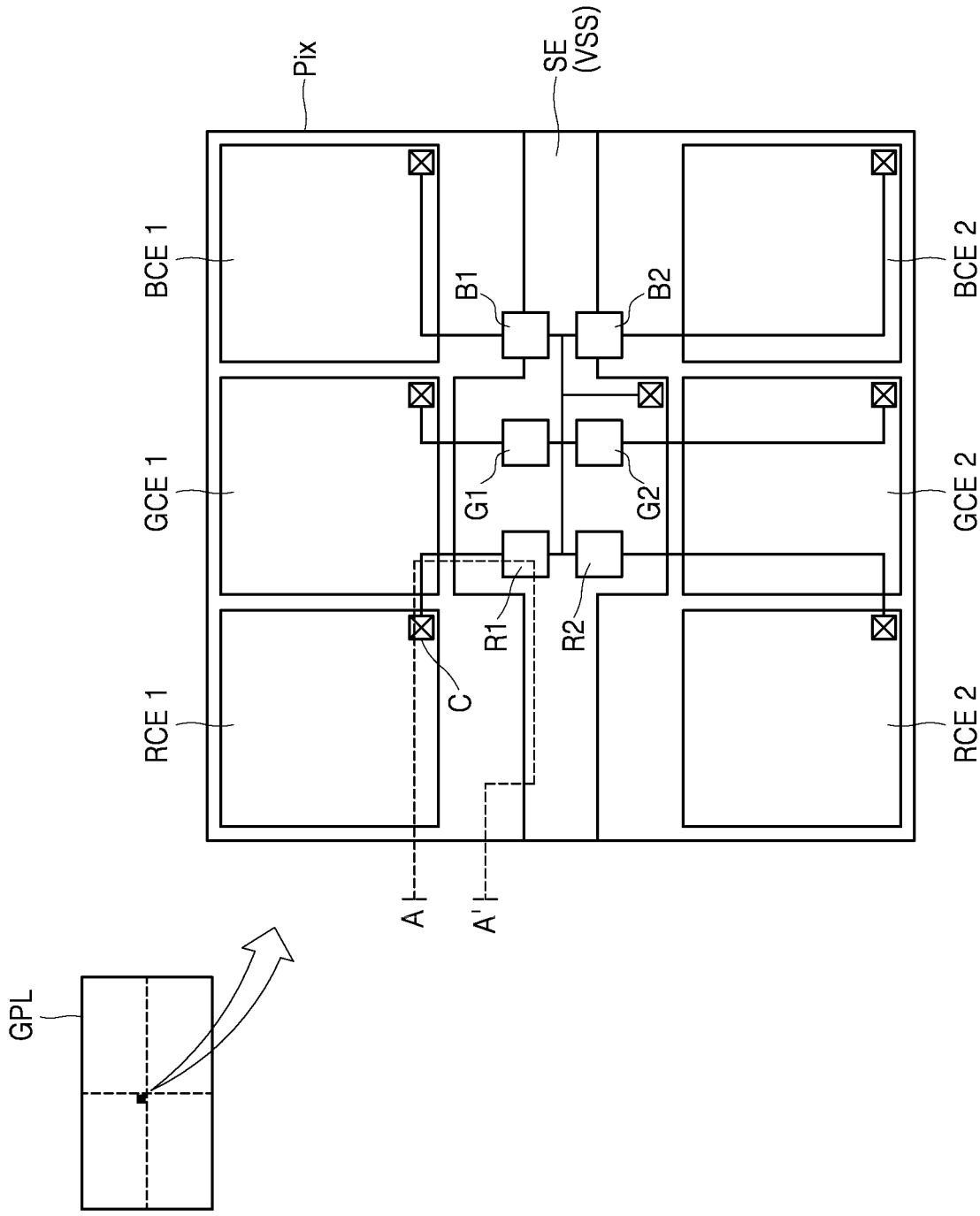
FIG. 3 is a block diagram of an example pixel structure at the center of the display panel of FIG. 1.
Figure 4:
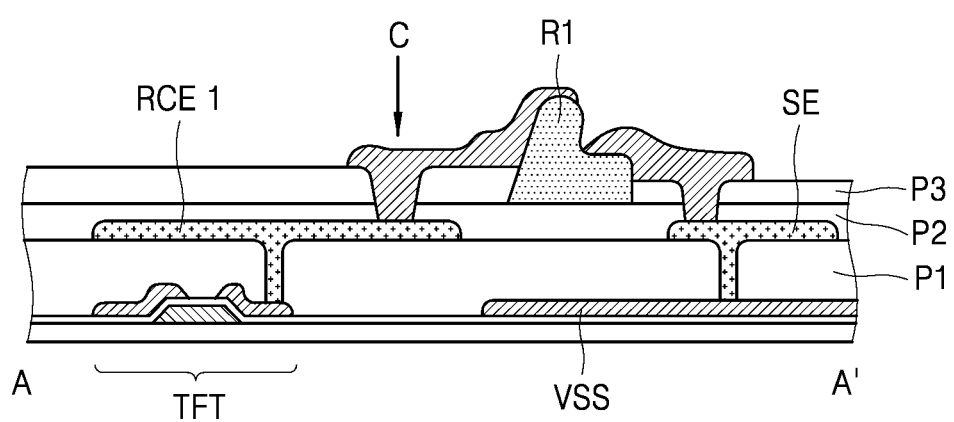
FIG. 4 is a cross sectional view taken along line A-A' of FIG. 3.

FIG. 3 is a block diagram of an example pixel structure at the center of the LED display panel of FIG. 1, and FIG. 4 is a cross sectional view taken along line A-A' of FIG. 3.

As shown in FIGS. 3 and 4, one or more of pixel regions Pix according to an example embodiment of the present disclosure may each include: a plurality of TFTs configured to switch a data voltage in response to a gate-on voltage; a low voltage contact pad SE to which a low voltage is applied; a plurality of data contact pads RCE1, GCE1, BCE1, RCE2, GCE2, BCE2 being in one-to-one correspondence with the plurality of TFTs to transmit the data voltage from the TFTs on a front surface thereof; and red LEDs R1, R2, green LEDs G1, G2, and blue LEDs B1, B2, each LED emitting light upon receiving the low voltage from the low voltage contact pad SE at its cathode and upon receiving the data voltage from a corresponding one of the plurality of data contact pads RCE1, GCE1, BCE1, RCE2, GCE2, BCE2 at its anode.

A pixel structure according to the present disclosure is not limited to that illustrated in FIGS. 3 and 4. For example, one or more pixel regions Pix may each include one red subminiature LED R1, one green subminiature LED G1, and one blue subminiature LED B1. Here, each pixel region Pix may include three TFTs corresponding to the red, green, blue subminiature LEDs R1, G1, B1, three data contact pads RCE1, GCE1, BCE1 transmitting the data voltage from the TFTs to the subminiature LEDs, respectively, and one low voltage contact pad SE.

The TFTs in the pixel region Pix may be turned on upon receiving the gate-on voltage from one gate line GL. Then, the TFTs may transmit the data voltages from different data lines DL to the data contact pads RCE1, GCE1, BCE1, respectively.

Each of the red, green, and blue subminiature LEDs R1, G1, B1 may receive the low voltage from the low voltage contact pad SE at its cathode and may receive the data voltage from a corresponding one of the data contact pads RCE1, GCE1, BCE1 at its anode to emit light at a brightness corresponding to the respective data voltage. Here, the cathode of each of the subminiature LEDs R1, G1, B1 may be electrically connected to the low voltage contact pad SE via a common cathode link line. In addition, the anode of each of the subminiature LEDs R1, G1, B1 may be electrically connected to the corresponding one of the data contact pads RCE1, GCE1, BCE1 via a respective anode link line.

In FIG. 3, an example pixel region Pix is shown as including six TFTs, one low voltage contact pad SE, six data contact pads RCE1, GCE1, BCE1, RCE2, GCE2, BCE2, and two red subminiature LEDs R1, R2, two green subminiature LEDs G1, G2, and two blue subminiature LEDs B1, B2. However, it should be understood that the present disclosure is not limited to the example shown in FIG. 3, and the number, configuration, and layout of the aforementioned components may be varied. For example, one or more pixel regions Pix may each include one red LED R1, one green LED G1, and one blue LED B1. In this case, the pixel region Pix may include three data contact pads RCE1, GCE1, BCE1 applying the data voltages to the red, green, blue subminiature LEDs R1, G1, B1, respectively. Alternatively, one or more pixel regions Pix may further include a white LED in addition to the red, green, and blue subminiature LEDs R1, G1, B1. In this case, the pixel region Pix may further include a data contact pad applying a data voltage to the white LED in addition to the data contact pads RCE1, GCE1, BCE1 applying the data voltages to the red, green, and blue subminiature LEDs R1, G1, B1, respectively. As a further alternative, one or more pixel regions Pix may include only one or more white LEDs without the red, green, and blue subminiature LEDs R1, G1, B1. In this case, the pixel region Pix may further include red, green, and blue color filters corresponding in number to the number of white subminiature LEDs or the number of white subminiature LEDs less one.

As described above, according to the present disclosure, if the base substrate ZPL is configured such that the area of the image display region AP or the size of the pixel regions Pix is increased or reduced, it is not necessary to change the layout of a plurality of subminiature LEDs, e.g., R1, R2, G1, G2, B1, B2, to be mounted or deposited on each pixel region Pix. Here, a pixel region Pix at the center of the image display region AP may have the subminiature LEDs R1, R2, G1, G2, B1, B2 at the center of the pixel region AP, as shown in FIG. 3.

As shown in FIG. 3, the low voltage contact pad SE may be disposed at the center of the pixel region Pix and the subminiature LEDs R1, R2, G1, G2, B1, B2 may be disposed on a front side of the low voltage contact pad SE. Here, each of the subminiature LEDs R1, R2, G1, G2, B1, B2 may emit light upon receiving, at its cathode, the low voltage from the low voltage contact pad SE and upon receiving, at its anode, the data voltage from the corresponding one of the data contact pads RCE1, GCE1, BCE1, RCE2, GCE2, BCE2 via the respective anode link line.

If the subminiature LEDs R1, R2, G1, G2, B1, B2 are disposed at the center of the pixel region Pix, the anode of each of the Subminiature LEDs R1, R2, G1, G2, B1, B2 may be connected to a contact point (hole) C at one corner of the corresponding one of the data contact pads RCE1, GCE1, BCE1, RCE2, GCE2, BCE2 via the respective anode link line to receive the data voltage.

Specifically, in a pixel region Pix adjacent to the center of the image display region AP, the contact point (hole) C of each of the data contact pads RCE1, GCE1, BCE1, RCE2, GCE2, BCE2 may be disposed closer to one corner of each data contact pad toward the center of the image display region AP. On the other hand, in a pixel region Pix adjacent to the periphery of the image display region AP, the contact point (hole) C of each of the data contact pads RCE1, GCE1, BCE1, RCE2, GCE2, BCE2 may be disposed closer to the other corner of the data contact pad diagonally away from the center of the image display region AP.

Accordingly, each of the subminiature LEDs R1, R2, G1, G2, B1, B2 disposed in a pixel region Pix adjacent to the center of the image display region may be connected to the contact hole C of the corresponding one of the data contact pads RCE1, GCE1, BCE1, RCE2, GCE2, BCE2 adjacent to the one corner of the data contact pad via the respective anode link line to receive the corresponding data voltage. On the other hand, each of the subminiature LEDs R1, R2, G1, G2, B1, B2 disposed in a pixel region Pix farther away from the center of the image display region AP may be connected to the contact hole C of the corresponding one of the data contact pads RCE1, GCE1, BCE1, RCE2, GCE2, BCE2 diagonally away from the one corner of the data contact pad via the respective anode link line to receive the corresponding data voltage.

In each pixel region Pix, the data contact pads, e.g., RCE1, GCE1, BCE1, RCE2, GCE2, BCE2, may correspond in number to the TFTs and the subminiature LEDs, e.g., including the red, green, and blue subminiature LEDs R1, R2, G1, G2, B1, B2. Here, the data contact pads, e.g., RCE1, GCE1, BCE1, RCE2, GCE2, BCE2, may be located in sections of the pixel region Pix excluding the area occupied by the low voltage contact pad SE, respectively.

Although each of the data contact pads RCE1, GCE1, BCE1, RCE2, GCE2, BCE2 is shown as having a square shape in FIG. 3, it should be understood that the present disclosure is not limited thereto, and one or more data contact pads may have a circular or polygonal shape in plan view. Here, the data contact pads RCE1, GCE1, BCE1, RCE2, GCE2, BCE2 may be located in sections of the pixel region Pix excluding the area occupied by the low voltage contact pad SE, respectively, wherein the sections are equal in area and size.

As illustrated in FIG. 4, in the pixel region Pix adjacent to the center of the image display region, the contact hole C of each of the data contact pads RCE1, GCE1, BCE1, RCE2, GCE2, BCE2 may be located adjacent to one corner of the data contact pad close to the center of the image display region PA. Thus, the contact hole C may be disposed close to the one corner of the data contact pad, e.g., RCE1. Here, each of the data contact pads RCE1, GCE1, BCE1, RCE2, GCE2, BCE2 may receive the data voltage from a corresponding one of the plurality of TFTs through a drain electrode and the contact hole C, and transmit the data voltage to a corresponding one of the red, green, and blue subminiature LEDs.

Particularly, each of the subminiature LEDs R1, G1, B1 may receive, at its cathode, the low voltage from the low voltage contact pad SE and receive, at its anode, the data voltage from a corresponding one of the data contact pads RCE1, GCE1, BCE1, thereby emitting light at a brightness corresponding to the data voltage. Here, the cathode of each of the subminiature LEDs R1, G1, B1 may be electrically connected to the low voltage contact pad SE via the common cathode link line. In addition, the anode of each of the subminiature LEDs R1, G1, B1 may be electrically connected to a corresponding one of the data contact pads RCE1, GCE1, BCE1 via the respective anode link line.

Figure 5:
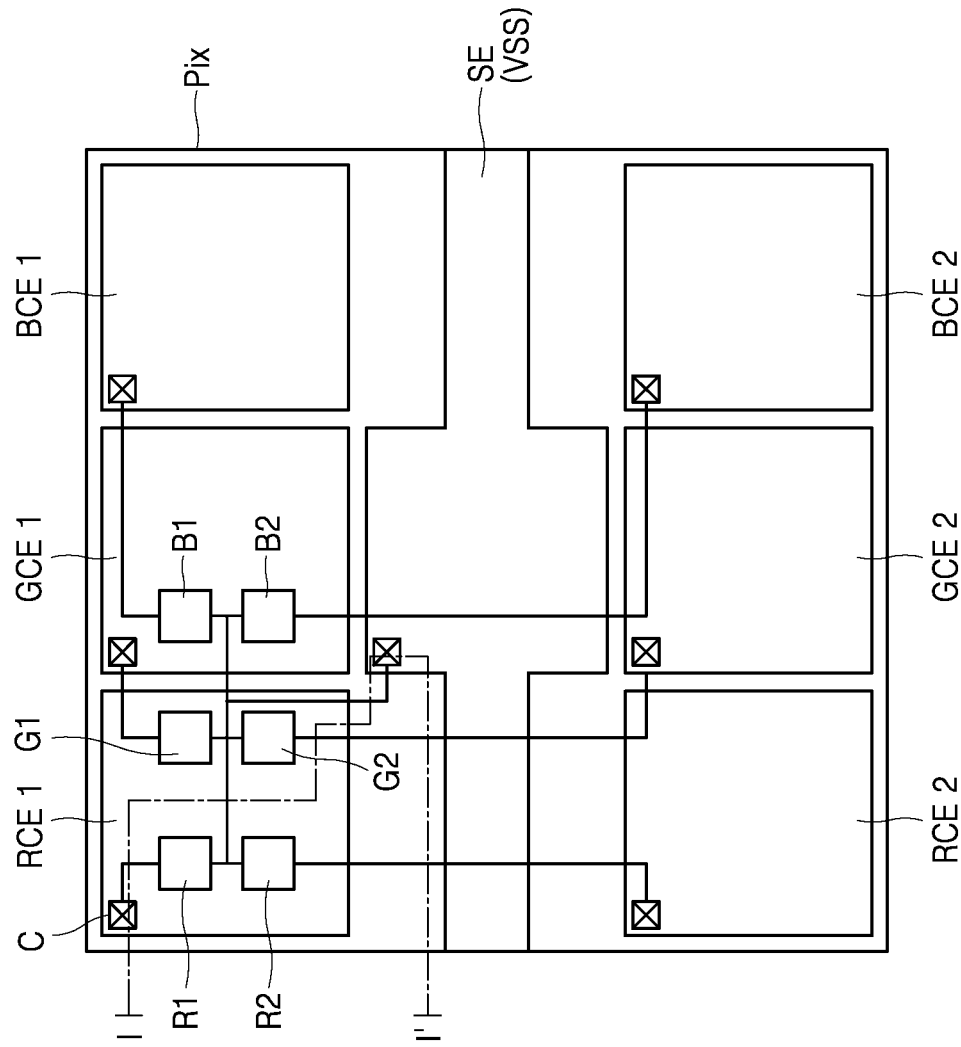
FIG. 5 is a block diagram of an example a pixel structure at the outermost portion of the display panel of FIG. 1.
Figure 5:
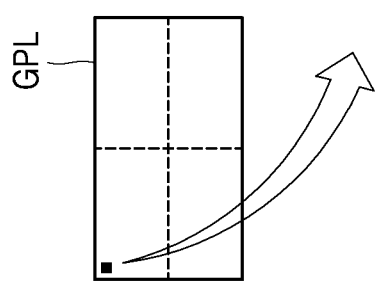
Figure 6:
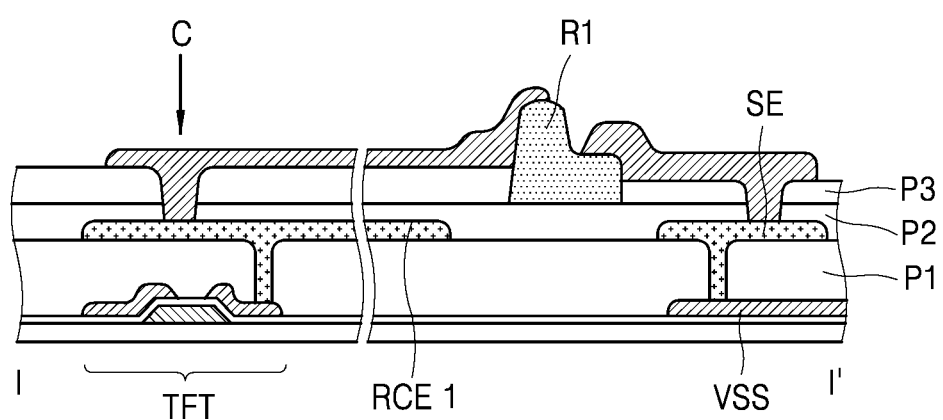
FIG. 6 is a cross sectional view taken along line I-I' of FIG. 5.

FIG. 5 is a block diagram of an example pixel structure adjacent to the outer periphery of the LED display panel of FIG. 1. FIG. 6 is a cross sectional view taken along line I-I' of FIG. 5.

As illustrated in FIGS. 5 and 6, if the base substrate ZPL is configured such that the area of the image display region AP or the size of the pixel regions Pix is reduced or increased, it is not necessary to change the layout of the subminiature LEDs, e.g., R1, R2, G1, G2, B1, B2, to be mounted or deposited in the pixel regions Pix. Accordingly, a pixel region Pix adjacent to the outer periphery of the image display region AP may have the subminiature LEDs, e.g., R1, R2, G1, G2, B1, B2, disposed at an outer periphery of the pixel region Pix, as shown in FIG. 5.

Specifically, depending on the degree of change in the area of the image display area AP or the size of the pixel regions Pix, the location of a group of subminiature LEDs, e.g., R1, R2, G1, G2, B1, B2, in a pixel region Pix may change at a particular rate corresponding to the distance of the pixel Pix region from the center of the image display region AP. For example, depending on the degree of increase or decrease in the area of the image display area AP or the size of the pixel regions Pix, the location of the group of subminiature LEDs, e.g., R1, R2, G1, G2, B1, B2, in the pixel region Pix may change in a diagonal direction.

Accordingly, the pixel region Pix adjacent to the outer periphery of the image display region PA may have a group of subminiature LEDs R1, R2, G1, G2, B1, B2 disposed adjacent to an outer periphery of the pixel region Pix, as shown in FIG. 5. Here, the group of subminiature LEDs R1, R2, G1, G2, B1, B2 may be disposed on a front side of one or more data contact pads, e.g., RCE1, GCE1, BCE1, RCE2, GCE2, BCE2. Each of the subminiature LEDs R1, R2, G1, G2, B1, B2 may emit light by receiving, at its cathode, the low voltage from the low voltage contact pad SE and receiving, at its anode thereof, the data voltage from a corresponding one of the data contact pads RCE1, GCE1, BCE1, RCE2, GCE2, BCE2.

If the group of subminiature LEDs R1, R2, G1, G2, B1, B2 is disposed at a corner or edge of the pixel region Pix, the anode of each of the subminiature LEDs R1, R2, G1, G2, B1 B2 may be connected to the contact hole C at a corner of the corresponding one of the data contact pads RCE1, GCE1, BCE1, RCE2, GCE2, BCE2 away from the center of the image display region AP via the respective anode link line to receive the data voltage.

In FIG. 4, since the pixel region Pix is adjacent to the center of the image display region PA, the contact hole C of each of the data contact pads RCE1, GCE1, BCE1, RCE2, GCE2, BCE2 may be located adjacent to one corner of the data contact pad closer to the center of the image display region PA. Accordingly, the contact hole C may be disposed close to the one corner of each data contact pad. In FIG. 6, since the pixel region Pix is located far from the center of the image display region PA, the contact hole C of each of the data contact pads RCE1, GCE1, BCE1, RCE2, GCE2, BCE2 may be located adjacent to the other corner of the data contact pad diagonally away from the center of the image display region PA. Accordingly, each of the subminiature LEDs R1, R2, G1, G2, B1, B2 disposed in the pixel region Pix far from the center of the image display region may be connected to the contact hole C diagonally away from one corner of the corresponding one of the data contact pads RCE1, GCE1, BCE1, RCE2, GCE2, BCE2 close to the center of the image display region PA via the respective anode link line to receive the data voltage.

FIG. 7 is a diagram illustrating data voltage contact positions of a narrow- or zero-bezel type TFT switching substrate with subminiature LEDs arranged in a particular pattern thereon according to an example embodiment.

As illustrated in FIG. 7, if the base substrate ZPL is configured such that the overall size or area of the pixel regions Pix is reduced due to the plurality of pads PD at the outer periphery of the substrate ZPL, the group of subminiature LEDs may be arranged with respect to the center of the base substrate ZPL without changing the layout of the subminiature LEDs, such that a pixel region Pix farther away from the center of the image display region PA has the subminiature LEDs, e.g., R1, R2, G1, G2, B1, B2, arranged in the same direction as the direction away from the center of the image display region PA. In other words, subminiature LEDs R1, R2, G1, G2, B1, B2 in a pixel region Pix at the center of the image display region PA and subminiature LEDs R1, R2, G1, G2, B1, B2 in other pixel regions Pix farther away from the center of the image display region PA may be arranged in the particular pattern in the direction away from the center of the image display region PA depending on the area of the image display region PA or the size of the pixel regions Pix.

Here, a pixel region Pix farther away from the center of the image display region PA has a group of the subminiature LEDs located closer to the outer periphery of the pixel region Pix. Particularly, the groups of subminiature LEDs disposed in the respective pixel regions Pix of the base substrate ZPL may be equally spaced apart from one another in a direction away from the center of the image display region PA. Similarly, the contact hole C of each of the data contact pads RCE1, GCE1, BCE1, RCE2, GCE2, BCE2 may be located closer to the other corner of the corresponding data contact pad diagonally away from the center of the image display region PA.

In addition, the distance between adjacent subminiature LEDs in the direction away from the center of the image display region PA may vary depending on the area of the image display region PA or the size of the pixel regions Pix. Here, depending on the degree of change in the area of the image display area PA or the size of the pixel regions Pix, the location of a group of subminiature LEDs, e.g., R1, R2, G1, G2, B1, B2, in a pixel region Pix may change by an amount corresponding to the distance of the pixel region PA from the center of the image display region PA. Specifically, depending upon the amount of increase or decrease in the area of the image display region PA or the size of the pixel regions Pix, the location of the group of subminiature LEDs, e.g., R1, R2, G1, G2, B1, B2, in each pixel region Pix may change in a diagonal direction.

As described above, the present disclosure provides a display panel which allows for easy arrangement of subminiature LEDs in pixel regions of a TFT switching substrate for display devices, such as LCDs or OLED displays, thereby reducing design and production costs and improving automated design efficiency, and a display apparatus using the same.

In addition, the present disclosure provides a narrow-bezel or zero-bezel display panel which allows subminiature LEDs to be arranged in pixel regions without any additional design change in manufacture thereof, thereby reducing design and production costs, and a display apparatus using the same.

Further, the present disclosure provides a display panel which allows groups of subminiature LEDs to be respectively arranged in pixel regions in a particular pattern in a direction away from the center of the base substrate, thereby improving ease of automated design and panel inspection.

It will be apparent to those skilled in the art that various modifications and variations can be made in a display panel, and a display apparatus using the same, of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display panel, comprising:
   a base substrate comprising:
      a plurality of pixel regions having corresponding gate lines and data lines; and
      a plurality of pads arranged at an outer periphery of the base substrate; and
   a group of subminiature light emitting diodes (LEDs) in each of the pixel regions to display an image,
   wherein the subminiature LEDs in one of the pixel regions are arranged at locations within the one of the pixel regions based on a location of the one of the pixel regions with respect to a center of the base substrate,
   wherein the one of the pixel regions comprises:
      a plurality of thin film transistors (TFTs) configured to switch on data voltages in response to a gate-on voltage;
      a low voltage contact pad configured to receive a low supply voltage; and
      a plurality of data contact pads, each configured to transmit a corresponding one of the data voltages from a corresponding one of the TFTs to a corresponding one of the subminiature LEDs, and
   wherein the subminiature LEDs in the one of the pixel regions comprise:
      at least one red LED, at least one green LED, and at least one blue LED, each of which has a cathode and an anode, and is configured to emit light by receiving, at the cathode, the low supply voltage from the low voltage contact pad and by receiving, at the anode, a corresponding one of the data voltages from a corresponding one of the data contact pads.

2. The display panel of claim 1, wherein the subminiature LEDs in the one of the pixel regions are arranged at locations within the one of the pixel regions based on a direction in which the one of the pixel regions is disposed away from the center of the base substrate and on a distance between the one of the pixel regions and the center of the base substrate.

3. The display panel of claim 1, wherein the pixel regions include a first pixel region and a second pixel region farther away from the center of the base substrate than the first pixel region in a plan view,
   wherein the subminiature LEDs of the first pixel region are arranged in a substantially same pattern as the subminiature LEDs of the second pixel region, and
   wherein, on average, the subminiature LEDs of the second pixel region are arranged farther away from a center of the second pixel region than the subminiature LEDs of the first pixel region are from a center of the first pixel region in the plan view.

4. The display panel of claim 1, wherein each of the data contact pads is configured to receive the corresponding one of the data voltages from the corresponding one of the TFTs and to supply the corresponding one of the data voltage to a corresponding one of the at least one red, at least one green, and at least one blue subminiature LEDs.

5. The display panel of claim 1, wherein the data contact pads correspond in number to the TFTs or to the subminiature LEDs, and are respectively located in sections of the one of the pixel regions excluding an area occupied by the low voltage contact pad.

6. The display panel of claim 1, wherein the data contact pads each have a planar shape with substantially equal area and size with one another, and are each connected to the corresponding one of the subminiature LEDs via a contact point, and
   wherein the contact point is positioned at a location with respect to the corresponding one of the data pads based on the location of the one of the pixel regions with respect to the center of the base substrate.

7. A display apparatus, comprising:
   a display panel comprising:
      a base substrate having a plurality of pixel regions; and
      a group of subminiature light emitting diodes (LEDs) in each of the pixel regions to display an image, the subminiature LEDs in one of the pixel regions being disposed at locations within the one of the pixel regions based on a direction in which the one of the pixel regions is disposed away from a center of the base substrate and on a distance between the one of the pixel regions and the center of the base substrate; and
   a driving circuit configured to apply a high voltage and a low voltage to the pixel regions and to drive gate lines and data lines of the pixel regions such that an image is displayed by the subminiature LEDs in the pixel regions, wherein the one of the pixel regions comprises:
- a plurality of thin film transistors (TFTs) configured to switch on data voltages in response to a gate-on voltage;
- a low voltage contact pad configured to receive a low supply voltage; and
- a plurality of data contact pads, each configured to transmit a corresponding one of the data voltages from a corresponding one of the TFTs to a corresponding one of the subminiature LEDs, and wherein the subminiature LEDs in the one of the pixel regions comprise:
- at least one red LED, at least one green LED, and at least one blue LED, each of which has a cathode and an anode, and is configured to emit light by receiving, at the cathode, the low supply voltage from the low voltage contact pad and by receiving, at the anode, a corresponding one of the data voltages from a corresponding one of the data contact pads.

8. The display apparatus of claim 7, wherein:
the driving circuit is disposed on a back side of the base substrate, and is configured to apply the high voltage and the low voltage to the pixel regions via a high voltage supply line and a low voltage supply line, respectively,
the high voltage supply line and low voltage supply line each extend from the back side to a front side of the base substrate,
the gate lines and the data lines extend from the back side of the base substrate to the respective pixel regions in the front side of the base substrate, and
the driving circuit is further configured to drive the gate lines and the data lines to cause the subminiature LEDs in the respective pixel regions to display an image.

9. The display apparatus of claim 7, wherein the pixel regions include a first pixel region and a second pixel region farther away from the center of the base substrate than the first pixel region in a plan view,
wherein the subminiature LEDs of the first pixel region are arranged in a substantially same pattern as the subminiature LEDs of the second pixel region, and
wherein, on average, the subminiature LEDs of the second pixel region are arranged farther away from a center of the second pixel region than the subminiature LEDs of the first pixel region are from a center of the first pixel region in the plan view.

10. The display apparatus of claim 7, wherein each of the data contact pads is configured to receive the corresponding one of the data voltages from the corresponding one of the TFTs and to supply the corresponding one of the data voltage to a corresponding one of the at least one red, at least one green, and at least one blue subminiature LEDs.

11. The display apparatus of claim 7, wherein the data contact pads correspond in number to the TFTs or to the subminiature LEDs, and are respectively located in sections of the one of the pixel regions excluding an area occupied by the low voltage contact pad.

12. The display apparatus of claim 7, wherein the data contact pads each have a planar shape with substantially equal area and size with one another, and are each connected to the corresponding one of the subminiature LEDs via a contact point, and
wherein the contact point is positioned at a location with respect to the corresponding one of the data pads based on a location of the one of the pixel regions with respect to the center of the base substrate.

13. An apparatus, comprising:
a matrix of pixel regions on a substrate and having a first arrangement with a first pitch between adjacent pixel regions;
a set of connection pads in each of the pixel regions and having a uniform layout; and
a matrix of micro-sized light emitting diodes (LEDs) in each of the pixel regions to output images on a display screen, the matrix of micro-sized LEDs having a second arrangement different from the first arrangement and a second pitch between adjacent micro-sized LEDs different from the first pitch,
wherein each of the micro-sized LEDs in one of the pixel regions is electrically connected via a contact point to a corresponding one of the connection pads in the one of the pixel regions,
wherein the one of the pixel regions comprises:
- a plurality of thin film transistors (TFTs) configured to switch on data voltages in response to a gate-on voltage;
- a low voltage contact pad configured to receive a low supply voltage; and
- a plurality of data contact pads, each configured to transmit a corresponding one of the data voltages from a corresponding one of the TFTs to a corresponding one of the subminiature LEDs, and wherein the subminiature LEDs in the one of the pixel regions comprise:
- at least one red LED, at least one green LED, and at least one blue LED, each of which has a cathode and an anode, and is configured to emit light by receiving, at the cathode, the low supply voltage from the low voltage contact pad and by receiving, at the anode, a corresponding one of the data voltages from a corresponding one of the data contact pads.

14. The apparatus of claim 13, wherein each of the connection pads in the one of the pixel regions has a uniform size sufficient to accommodate its corresponding micro-sized LED.

15. The apparatus of claim 14, wherein a first set of micro-sized LEDs in a first pixel region near a central area of the matrix of pixel regions has a first set of contact points, and a second set of micro-sized LEDs in a second pixel region near an edge of the matrix of pixel regions has a second set of contact points that are arranged differently from the first set of contact points.

16. The apparatus of claim 15, wherein the uniform layout and the uniform size of the connection pads depend upon an overall size of the display screen or of the matrix of micro-sized LEDs.

17. The apparatus of claim 13, wherein the connection pads in the one of the pixel regions include six pads, and the micro-sized LEDs in the one of the pixel regions include a pair of red LEDs, a pair of green LEDs and a pair of blue LEDs.

18. The apparatus of claim 17, wherein the connection pads in the one of the pixel regions further include a seventh pad configured to provide contact with a supply voltage (Vss) for the one of the pixel regions.

* * * * *